United States Patent
Xiao

(10) Patent No.: US 9,472,155 B2
(45) Date of Patent: Oct. 18, 2016

(54) GATE DRIVER CIRCUIT BASING ON IGZO PROCESS

(71) Applicant: Shenzhen China Star Optoelectronics Technology Co., Ltd., Shenzhen, Guangdong (CN)

(72) Inventor: Juncheng Xiao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 85 days.

(21) Appl. No.: 14/426,366

(22) PCT Filed: Sep. 19, 2014

(86) PCT No.: PCT/CN2014/086888
§ 371 (c)(1),
(2) Date: Mar. 5, 2015

(87) PCT Pub. No.: WO2016/037380
PCT Pub. Date: Mar. 17, 2016

(65) Prior Publication Data
US 2016/0247476 A1   Aug. 25, 2016

(30) Foreign Application Priority Data

Sep. 10, 2014 (CN) .......................... 2014 1 0457955

(51) Int. Cl.
*H03K 17/10* (2006.01)
*G09G 3/36* (2006.01)
*G11C 19/28* (2006.01)

(52) U.S. Cl.
CPC .............. *G09G 3/3677* (2013.01); *G11C 19/28* (2013.01); *G09G 2300/0465* (2013.01); *G09G 2300/0871* (2013.01); *G09G 2310/0286* (2013.01)

(58) Field of Classification Search
CPC ....................................................... H03K 17/10
See application file for complete search history.

(56) References Cited

U.S. PATENT DOCUMENTS

| | | | |
|---|---|---|---|
| 8,983,020 B2* | 3/2015 | Chien ................... | G09G 3/3677 377/64 |
| 2013/0088265 A1* | 4/2013 | Chen ...................... | H03K 5/153 327/108 |
| 2016/0125828 A1* | 5/2016 | Xiao .................... | G09G 3/3677 345/214 |

* cited by examiner

Primary Examiner — Hai L Nguyen
(74) Attorney, Agent, or Firm — Andrew C. Cheng

(57) ABSTRACT

The present invention provides a gate driver basing on IGZO process, comprising: GOAs in cascade connection comprising a $N^{th}$-stage GOA, wherein the $N^{th}$-stage GOA further comprising: a pull-up control part 100, a pull-up part 200, a transfer part 300, a pull-down part 400, a pull-down holding part 500, a boost part 600, a first negative supply VSS1, a second negative supply VSS2, a third negative supply VSS3, which are three gradually decreasing negative supplies and pull down an output terminal G(N), a first node Q(N), a second node P(N), and a driving single ST(N) to prevent the electrical leakage of TFTs effectively. And channels of the TFT switches of the gate driver basing on the IGZO process are oxide semiconductor channels.

10 Claims, 11 Drawing Sheets

US 9,472,155 B2

GATE DRIVER CIRCUIT BASING ON IGZO PROCESS

TECHNICAL FIELD

The present invention relates to LCD field, especially relating to a gate driver basing on IGZO process.

DESCRIPTION OF RELATED ART

The GOA (Gate Driver On Array) is a skill providing gate divers on TFT array substrates to scan line by line. A GOA circuit comprises a pull-up part, a pull-up control part, a transfer part, a pull-down part, a pull-down holding part, and a boost part.

A pull-up part is used for sending clock signals to the gates of TFT to provide driving signals of a LCD. A pull-up control part is used for controlling the pull-up part by signals from a former stage GOA usually. The pull-down part is used for pulling the scanning signal, i.e. the electrical potential of the gate of the TFT, to low level after sending out scanning signals. A pull-down holding part is used for maintaining scanning signals and the signals of the pull-up part, i.e. the signal of node Q, in closing state, which is the predetermined negative potential; and there are two pull-down holding parts work alternately. The pull-up part is used for pulling up again of the potential of node Q to ensure regularly output.

IGZO (indium gallium zinc oxide) is an amorphous oxide with indium, gallium, and zinc and its electron mobility is 20~30 times of amorphous silicon (a-Si). Therefore IGZO shall improve charging and discharging rates of TFTs, improve response rates, and improve scanning rates of pixels. And because of less TFTs and higher transmittance of pixels, the IGZO displayer has better efficacy.

The GOA of IGZO shall replace the a-Si of TFT, however not much developing is focusing on GOA of IGZO. Especially for the large scale GOA circuit, there are many issues, rising from IGZO materials should be solved. For example (1) Vth shifting to negative side and (2) if SS-region is too sheep, a tiny voltage change will change the order of the magnitude of electric currents. Thus these issues will lead to electrical leakages of TFTs of the GOA and fails of the GOA of the IGZO.

Please refer to FIG. 1 and FIG. 2, which are sequence diagrams showing GOA components and signals of prior art. The normal GOA comprises a first transistor T1, which gate and source both electrically connect Input, which drain electrically connects node Q; a second transistor T2, which gate electrically connects node Q, which source electrically connects Clock, which drain electrically connects Output; a third transistor T3, which gate electrically connects Reset, which source electrically connects Output, which drain electrically connects a negative potential VSS; a fourth transistor T4, which gate electrically connects Reset, which source electrically connects node Q, which drain electrically connects the negative potential VSS; a capacitor Cb, which one point connects node Q, which another side connects Output; the FIG. 1 further comprises a pull-down and compensation module which has four wires connected node Q, Clock, Output, VSS respectively.

The first transistor T1 is used for conducting the second transistor T2 according to signals in Input; the second transistor T2 is used for sending signals from Output according to CLK; the third transistor T3 and the fourth transistor T4 are used for pulling down potentials of node Q and Output when the gate driver is not working; the capacitor Cb is used for pulling up node Q again to ensure the Output output well.

SUMMARY

It is an object of this invention to provide a gate driver circuit basing on IGZO process to save expends of making LCD display by GOA technique, to save the package time of module productions; to prevent electrical leakages of TFTs by a pull-down and compensation module of the GOA basing on IGZO process, to effectively minimize the amount of TFTs, to reduce parasitic capacitances of TFTs reasonably and reduce consumptions of electrical circuits effectively.

Therefore, the present invention provides a gate driver basing on IGZO process comprising GOAs in cascade connection comprising a $N^{th}$-stage GOA, wherein the N is a positive integer, wherein the $N^{th}$-stage GOA further comprising a pull-up part having a first transistor, wherein a gate of the first transistor electrically connects a first note, a source of the first transistor electrically connects a first clock signal, a drain of first transistor electrically connects an output terminal, wherein the first transistor is used for outputting signals on the output terminal according to the first clock signal; a transfer part having a second transistor, wherein a gate of the second transistor electrically connects the first note, a source of the second transistor electrically connects the first clock signal, a drain of the second transistor electrically connects a driving signal terminal, wherein the second transistor is used for outputting the diving signal from the driving signal terminal according to the first clock signal; a pull-up control part having a third transistor, wherein a gate of the third transistor electrically connects the driving signal terminal of a $N-1^{th}$-stage GOA, a source of the third transistor electrically connects the output terminal of the $N-1^{th}$-stage GOA, the drain of the third transistor electrically connects the first note, wherein the third transistor is used for conducting the pull-up part according to the driving signal from the driving signal terminal; a pull-down holding part having a first pull-down holding circuit, the first pull-down holding circuit further comprising a fourth transistor, a fifth transistor, a sixth transistor, a seventh transistor, a eighth transistor, a ninth transistor, and a tenth transistor; wherein a gate of the fourth transistor electrically connects the first clock signal, a source of the fourth transistor also electrically connects the first clock signal, a drain of fourth transistor electrically connects a second note, a gate of the fifth transistor electrically connects the driving signal terminal, a source of the fifth transistor electrically connects the second note, a drain of the fifth transistor electrically connects a second negative supply, a gate of the sixth transistor electrically connects the driving signal terminal of the $N-1^{th}$-stage GOA, a source of the sixth transistor electrically connects the second note, a drain of the sixth transistor electrically connects the second negative supply, wherein the fifth transistor and the sixth transistor are used for pulling down the electrical potential of the second node when the driving signal terminal is in a high electrical potential, a gate of the seventh transistor electrically connects the second clock signal, a source of the seventh transistor electrically connects the first clock signal, a drain of the seventh transistor electrically connects the second note, a gate of the eighth transistor electrically connects the second note, a source of the eighth transistor electrically connects the output terminal, a drain of the eighth transistor electrically connects a first negative supply, a gate of the ninth transistor electrically connects the second note, a source of the ninth transistor electrically connects the first note, a drain of the ninth transistor electrically connects the second negative supply, a gate of the tenth transistor electrically connects the second note, a source of the tenth transistor electrically connects the driving signal terminal, a drain of the tenth transistor electrically connects a third negative supply; a pull-down part having a thirteenth transistor and a fifteenth transistor, wherein a gate of the thirteenth transistor electrically connects a driving signal terminal of the N+1$^{th}$-stage GOA, a source of the thirteenth transistor electrically connects the driving signal terminal, a drain of the thirteenth transistor electrically connects the third negative supply, wherein the thirteenth transistor is used for pulling down the electrical potential of the driving signal terminal to prevent electrical leakages of the fifth transistor and the sixth transistor when the gate driver is not working, a gate of the fifteenth transistor electrically connects the driving signal terminal of the N+1$^{th}$-stage GOA, a source of the fifteenth transistor electrically connects the first note, a drain of the fifteenth transistor electrically connects the driving signal terminal, wherein the fifteenth transistor is used for pulling down the electrical potential of the first node rapidly when the outputting terminal finishes outputting; and a boost part having a capacitor, wherein the capacitor electrically connects the first note and the output terminal, wherein the boost part is used for pulling up the electrical potential of the first node again to make sure the outputting terminal of the pull-up part output normally.

The present invention also provides the channels of the TFT switches of the said gate driver basing on the IGZO process are oxide semiconductor channels.

The present invention also provides the gate and source of the third transistor are both electrically connect the starting signal within the first-stage connection of the gate driver; and the gate of the thirteenth transistor and the gate of the fifteenth transistor both electrically connect the starting signal within the last-stage connection of the gate driver.

The present invention also provides the pull-down holding further comprising a second pull-down holding circuit having a eleventh transistor and a twelfth transistor wherein a gate of the eleventh transistor electrically connects a driving signal terminal of the N+2$^{th}$-stage GOA, a source of the eleventh transistor electrically connects the first note, a drain of the eleventh transistor electrically connects the second negative supply, a gate of the twelfth transistor electrically connects the driving signal terminal of the N+2$^{th}$-stage GOA, a source of the twelfth transistor electrically connects the output terminal, a drain of the twelfth transistor electrically connects the first negative supply.

And the gate of the eleventh transistor and the gate of the twelfth transistor both electrically connect the driving signal of the second-stage GOA within the last-stage connection of the gate driver.

The present invention also provides the pull-down part further comprises a fourteenth transistor, wherein a gate of the fourteenth transistor electrically connects the driving signal terminal of the N+1$^{th}$-stage GOA, a source of the fourteenth transistor electrically connects the output terminal, a drain of the fourteenth transistor electrically connects the first negative supply. And the gate of the fourteenth transistor electrically connects the starting signal within the last-stage connection of the gate driver.

The present invention also provides the electrical potential of the first negative supply is higher than the electrical potential of the second negative supply and the electrical potential of the second negative supply is higher than the electrical potential of the third negative supply. And the first negative supply is used for pulling down the electrical potential of the output terminal, the second negative supply is used for pulling down the electrical potential of the first note and the second note, and third negative supply is used for pulling down the electrical potential of the driving output terminal.

The present invention also provides the first clock signal and the second clock signal are high frequency clock signals with 180 degree phase difference from each other.

In summary, the gate driver basing on IGZO process of the present invention using three gradually decreasing negative supplies, the first node, and the second node shall pull down the electrical potential of the driving signal to overcome the electrical leakage of the TFTs of the gate driver with IGZO process. Besides, the gate driver of the present invention using the driving signal to handle the electrical potential of the second node shall reduce the loading effect of the first node, stabilize the first node well, and it is helpful for stabilizing outputting of the output terminal; the fifteenth transistor T15 of the pull-down part directly connecting the driving signal terminal shall pull down the first node faster and minimize the delay of the first node. Finally, a one-side asymmetric pull-down holding design according to the IGZO material shall save the amount of TFTs effectively, minimize the parasitic capacitances of the TFTs reasonably, and save consumption of electrical circuits effectively.

BRIEF DESCRIPTION OF THE DRAWINGS

The invention is best understood from the following detailed description when read in connection with the accompanying drawings, which illustrate an embodiment of the present invention. It shall be noticed that, however, the drawings showed as below are merely used for reference and illustrating, not for limiting the present invention.

DETAILED DESCRIPTION OF EMBODIMENTS

To describe the technique means and effects of present invention, here will now be described more specifically with reference to the following embodiments.

Figure 1:
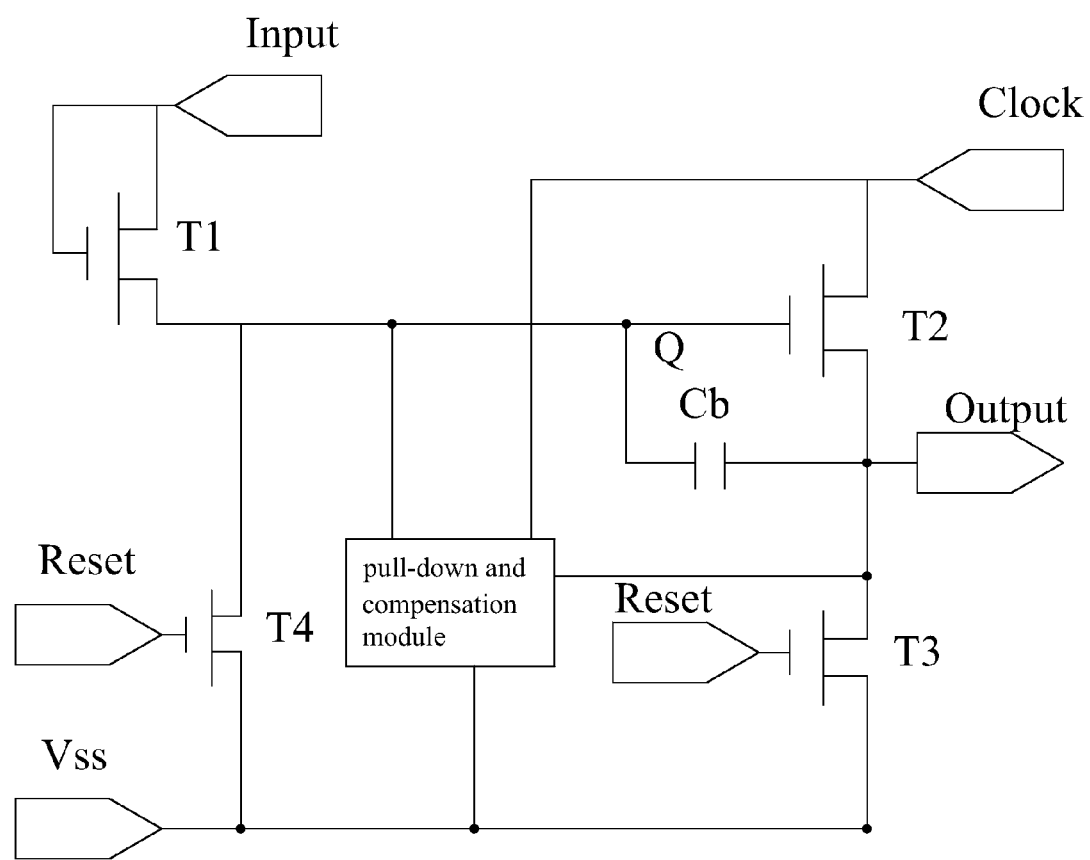
FIG. 1 is a picture showing a regular GOA circuit.
Figure 2:
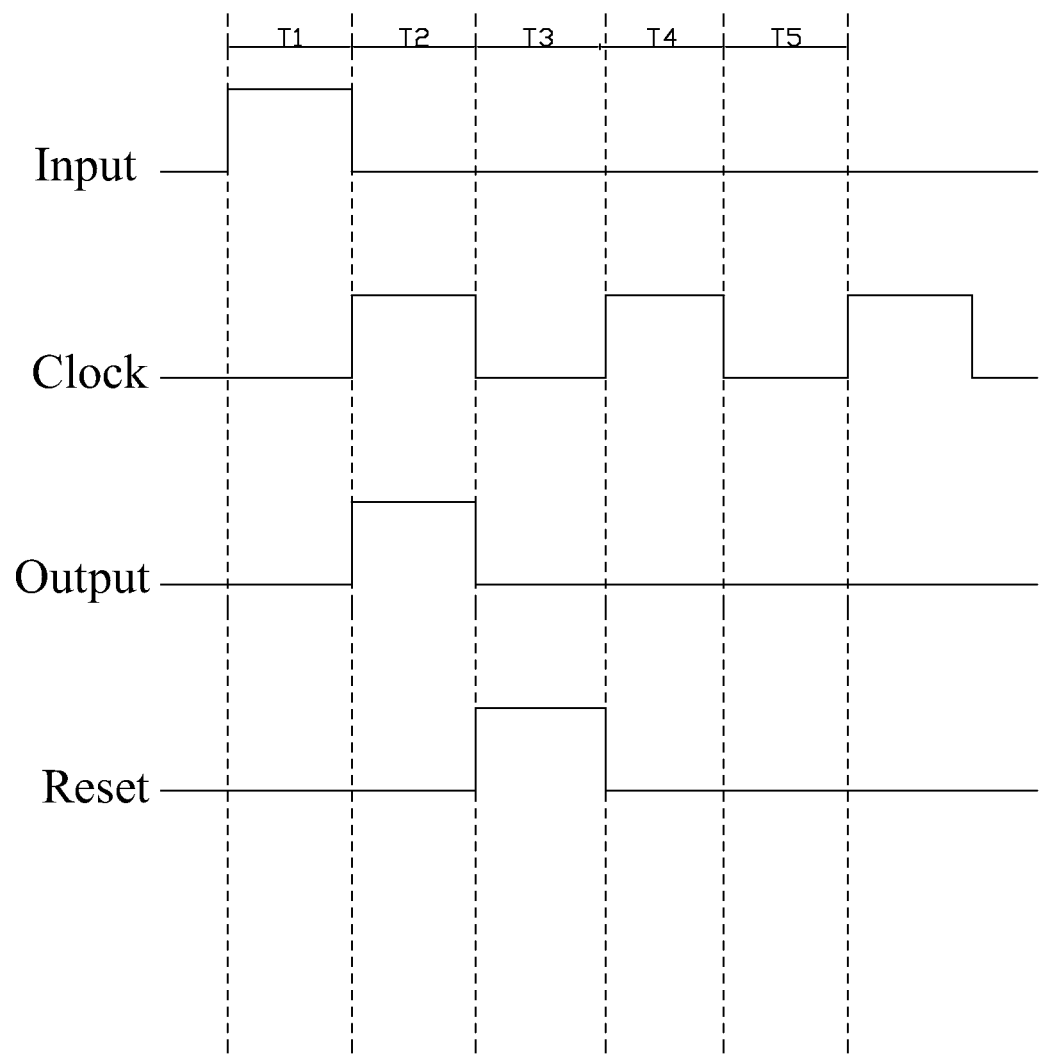
FIG. 2 is a sequence diagram showing signals of the GOA circuit in FIG. 1.
Figure 3:
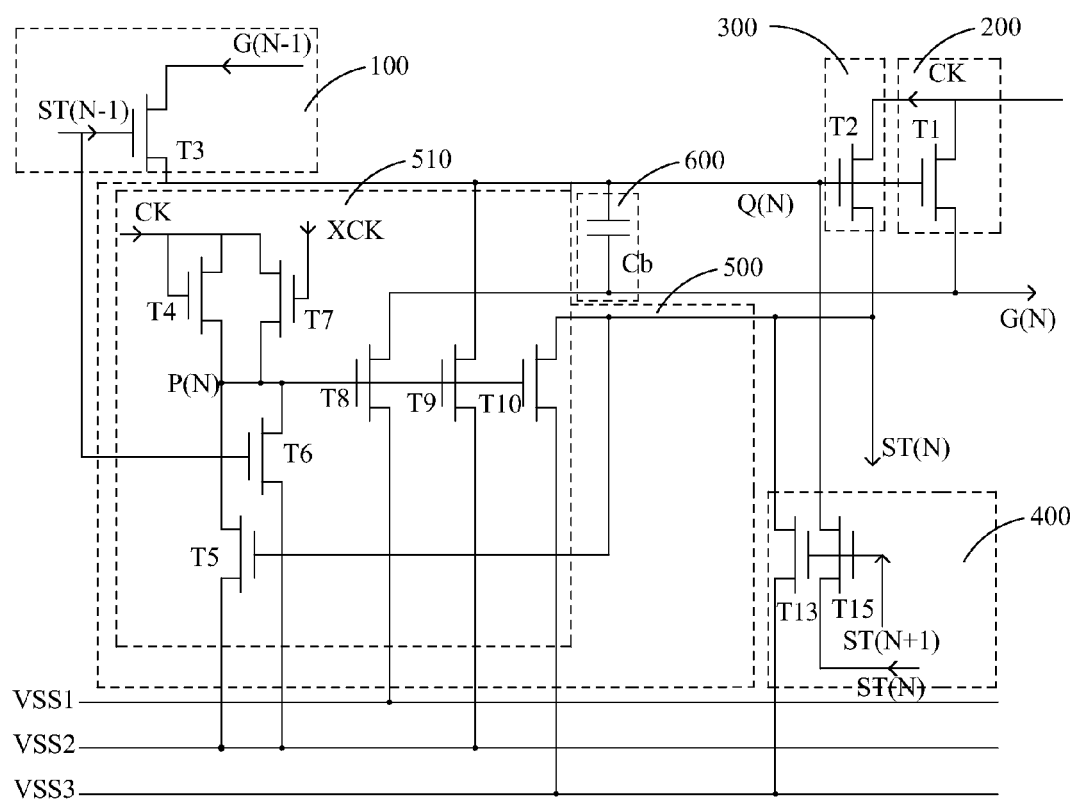
FIG. 3 is a picture showing circuits of the first embodiment of the gate driver basing on IGZO process of the present invention.
Figure 7:
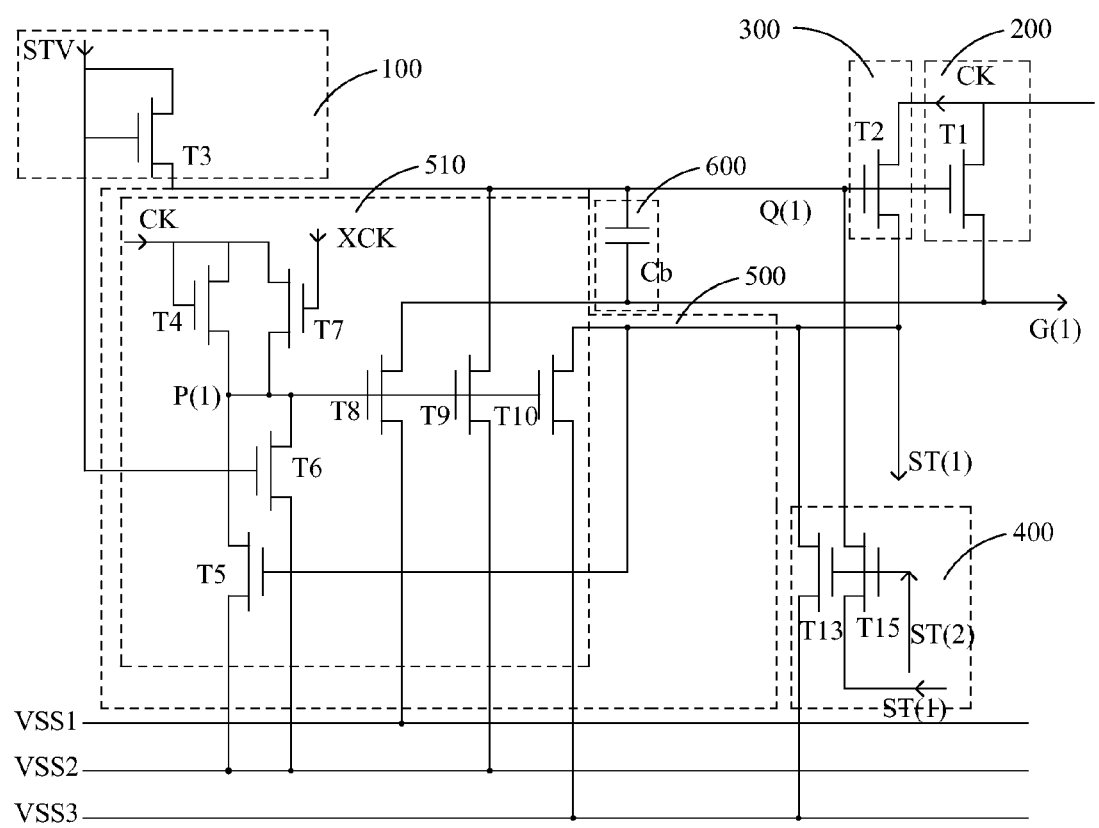
FIG. 7 is a picture showing the first stage GOA of the first embodiment of the gate driver basing on IGZO process of the present invention.
Figure 8:
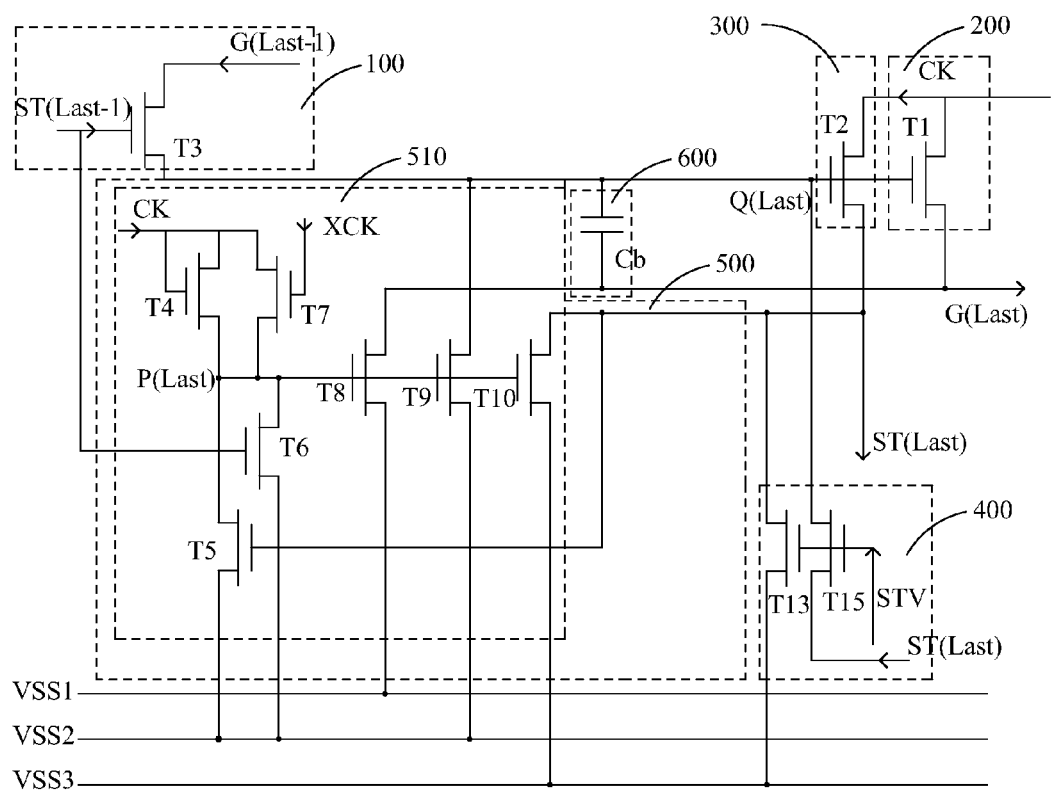
FIG. 8 is a picture showing the last stage GOA of the first embodiment of the gate driver basing on IGZO process of the present invention.

Please refer to FIG. 3, FIG. 7 and FIG. 8 which show the first embodiment of the gate driver basing on IGZO process of the present invention. The gate driver circuit basing on IGZO process comprises GOAs working of the cascade. Wherein the N is a positive integer. The $N^{th}$-stage GOA comprises: a pull-up control part 100, a pull-up part 200, a transfer part 300, a pull-down part 400, a pull-down holding part 500, a boost part 600.

The said pull-up part 200 comprises a first transistor T1. The gate of the first transistor T1 electrically connects a first node Q(N), the source of the first transistor T1 electrically connects a first clock signal CK, the drain of first transistor T1 electrically connects an output terminal G(N). The first transistor T1 is used for outputting the signal from the output terminal G(N) according to the first clock signal CK.

The said transfer part 300 comprises the second transistor T2. The gate of the second transistor T2 electrically connects the first node Q(N), the source of the second transistor T2 electrically connects the first clock signal CK, the drain of the second transistor T2 electrically connects a driving signal terminal ST(N). The second transistor T2 is used for outputting the driving signal from the driving signal terminal ST(N) according to the first clock signal CK.

The said pull-up control part 100 comprises the third transistor T3. The gate of the third transistor T3 electrically connects the driving signal terminal ST(N−1) of the N−$1^{th}$-stage GOA, the source of the third transistor T3 electrically connects the output terminal G(N−1) of the N−$1^{th}$-stage GOA, the drain of the third transistor T3 electrically connects the first node Q(N). The third transistor T3 is used for connecting the said pull-up part 200 according to the driving signal from the driving signal terminal ST(N−1).

The said pull-down holding part 500 comprises a first pull-down holding circuit 510. The first pull-down holding circuit 510 comprises a fourth transistor T4, a fifth transistor T5, a sixth transistor T6, a seventh transistor T7, a eighth transistor T8, a ninth transistor T9, and a tenth transistor T10.

The gate of the fourth transistor T4 electrically connects the first clock signal CK, the source of the fourth transistor T4 electrically also connects the first clock signal CK, the drain of fourth transistor T4 electrically connects a second node P(N).

The gate of the fifth transistor T5 electrically connects the driving signal terminal ST(N), the source of the fifth transistor T5 electrically also connects the second node P(N), the drain of the fifth transistor T5 electrically connects a second negative supply VSS2. The fifth transistor T5 is used for pulling down the electric potential of the second node P(N) when the driving signal terminal ST(N) of the $N^{th}$-stage GOA has a high electric potential.

The gate of the sixth transistor T6 electrically connects the driving signal terminal ST(N−1) of the N−$1^{th}$-stage GOA, the source of the sixth transistor T6 electrically also connects the second node P(N), the drain of the sixth transistor T6 electrically connects the second negative supply VSS2. The sixth transistor T6 is used for pulling down the electric potential of the second node P(N) when the driving signal terminal ST(N−1) of the N−$1^{th}$-stage GOA has a high electric potential.

The gate of the seventh transistor T7 electrically connects the second clock signal XCK, the source of the seventh transistor T7 electrically connects the first clock signal CK, the drain of the seventh transistor T7 electrically connects the second node P(N).

The gate of the eighth transistor T8 electrically connects the second node P(N), the source of the eighth transistor T8 electrically connects the output terminal G(N), the drain of the eighth transistor T8 electrically connects the first negative supply VSS1.

The gate of the ninth transistor T9 electrically connects the second node P(N), the source of the ninth transistor T9 electrically connects the first node Q(N), the drain of the ninth transistor T9 electrically connects the second negative supply VSS2.

The gate of the tenth transistor T10 electrically connects the second node P(N), the source of the tenth transistor T10 electrically connects the driving signal terminal ST(N), the drain of the tenth transistor T10 electrically connects the third negative supply VSS3.

The said pull-down part 400 comprises a thirteenth transistor T13 and a fifteenth transistor T15.

The gate of the thirteenth transistor T13 electrically connects the driving signal terminal ST(N+1) of the N+$1^{st}$-stage GOA, the source of the thirteenth transistor T13 electrically connects the driving signal terminal ST(N), the drain of the thirteenth transistor T13 electrically connects the third negative supply VSS3. The thirteenth transistor T13 is used for pulling down the electrical potential of the driving signal terminal ST(N) to prevent electric leakage of the fifth transistor T5 and sixth transistor T6 when the driving circuit is not working.

The gate of the fifteenth transistor T15 electrically connects the driving signal terminal ST(N+1) of the N+$1^{st}$-stage GOA, the source of the fifteenth transistor T15 electrically connects the first node Q(N), the drain of the fifteenth transistor T15 electrically connects the driving signal terminal ST(N). The fifteenth transistor T15 is used for pulling down the electrical potential of the first node Q(N) after the output terminal outputting.

The said boost part 600 comprises a capacitor Cb. The capacitor Cb electrically connects the first node Q(N) and the output terminal G(N) to pull up the electrical potential of the first node Q(N) and to ensure the output terminal of the pull-up part 200 work regularly.

The said first, second, third negative supply, VSS1, VSS2, and VSS3, each has different electrical potential. The electrical potential of the first negative supply VSS1 is higher than the electrical potential of the second negative supply VSS2; the electrical potential of the second negative supply VSS2 is higher than the electrical potential of the third negative supply VSS3.

The first negative supply VSS1 is used for pulling down the electrical potential of the output terminal G(N); the second negative supply VSS2 is used for pulling down the electrical potential of the first node Q(N) and the second node P(N); and third negative supply VSS3 is used for pulling down the electrical potential of the driving output terminal ST(N).

Showed as FIG. 7, the gate and the source of the third transistor T3 both electrically connect the starting signal STV in the first stage connection of the gate driver circuit basing on the IGZO process of the present invention.

Showed as FIG. 8, the gate of the thirteenth transistor T13 and the gate of the fifteenth transistor T15 both electrically connect the starting signal STV in the last stage connection of the gate driver circuit basing on the IGZO process of the present invention.

Moreover, the channels of the said TFT switches of the gate driver circuit basing on the IGZO process of the present invention are oxide semiconductor channels. And the first clock signal CK and the second clock signal XCK are high frequency clock signals with 180 degree phase difference from each other.

Figure 4:
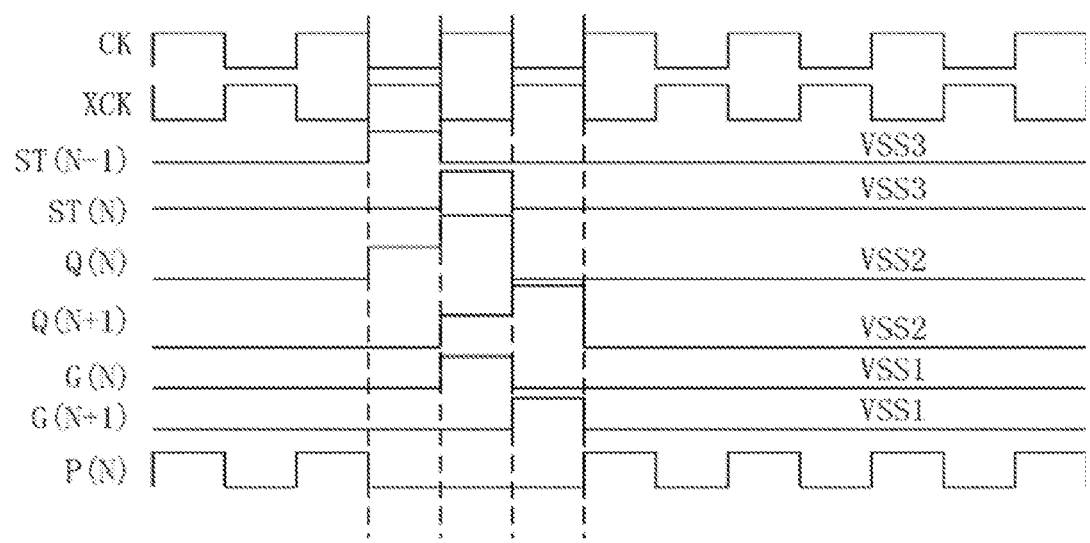
FIG. 4 is a sequence diagram showing signals and nodes of the gate driver basing on IGZO process.

Please refer to the FIG. 4, a sequence diagram showing signals and nodes of the gate driver basing on IGZO process, and combine the FIG. 3: the eighth transistor T8 is used for maintain the output terminal G(N) in low level; and the ninth transistor T9 is used for maintain the first node Q(N) in low level; the fifth transistor T5 is used for pulling down the electrical potential of the second node P(N) when the driving signal terminal ST(N) in high electrical potential; and the sixth transistor T6 is used for pulling down the second node P(N) when the driving signal terminal ST(N−1) in high electrical potential to cease the pull-down holding part 500 and to prevent the interferences of the first node Q(N) and the output terminal G(N).

The electrical potential of the second negative supply VSS2 is lower than the electrical potential of the first negative supply VSS1, and it lowers the electrical potential of the second node P(N) effectively by two partial voltage division theorem. The electrical potential of second node P(N) is lower, the transistors T8, T9, and T10 will be closed better. Thus, it shall prevent any irregular leakage of the output terminal G(N) and pull down the electrical potential of the first node Q(N) to close the transistors T1 and T2 better. The tenth transistor T10 and thirteenth transistor T13 are used for pulling down the driving signal terminal ST(N); and the third negative supply VSS3 is used for pulling down the electrical potential of the driving signal terminal ST(N) to prevent electrical leakages of the fifth transistor T5 and sixth transistor T6 when the gate driver circuit is not working. The fifteenth transistor T15 is used for pulling down the first node Q(N) after outputting from the output terminal G(N) to ensure the first node Q(N) lower its electrical potential rapidly from a high electrical potential to a low electrical potential; moreover, the drain of the fifth transistor T15 connecting the driving signal terminal ST(N) is also used for pulling down the first node Q(N) after outputting from the output terminal G(N).

Figure 5:
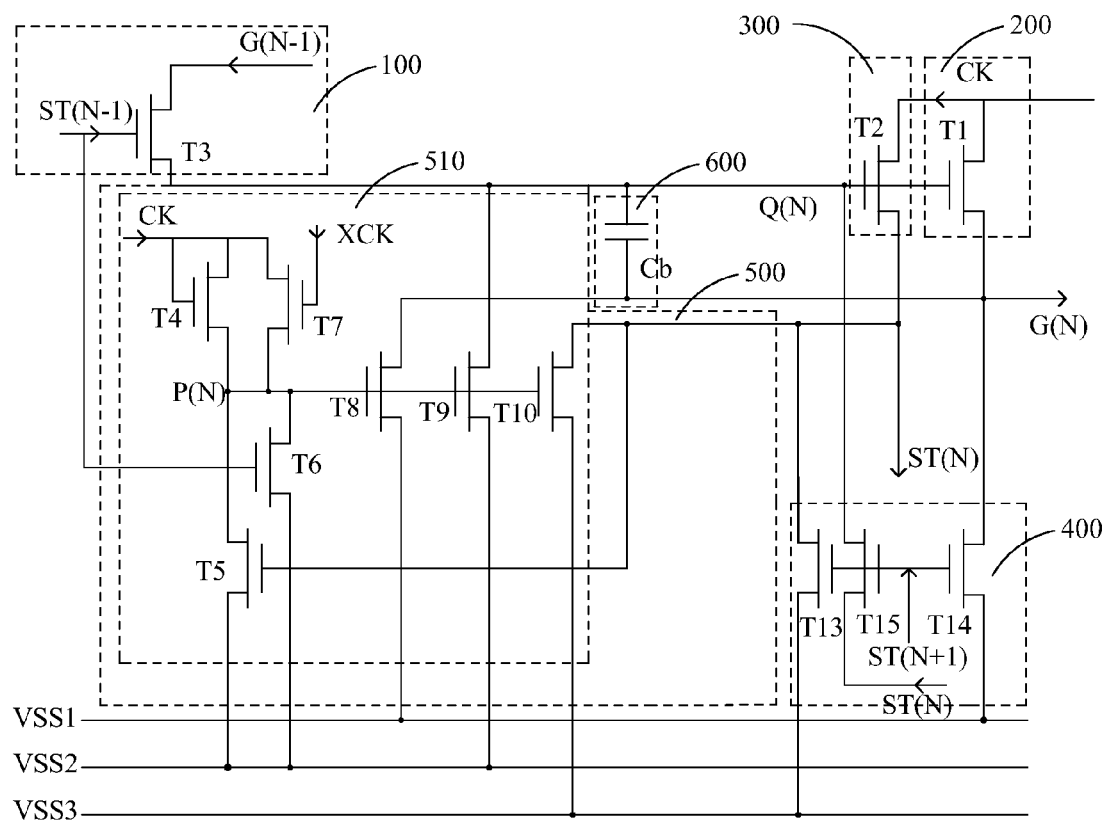
FIG. 5 is a picture showing circuits of the second embodiment of the gate driver basing on IGZO process of the present invention.
Figure 9:
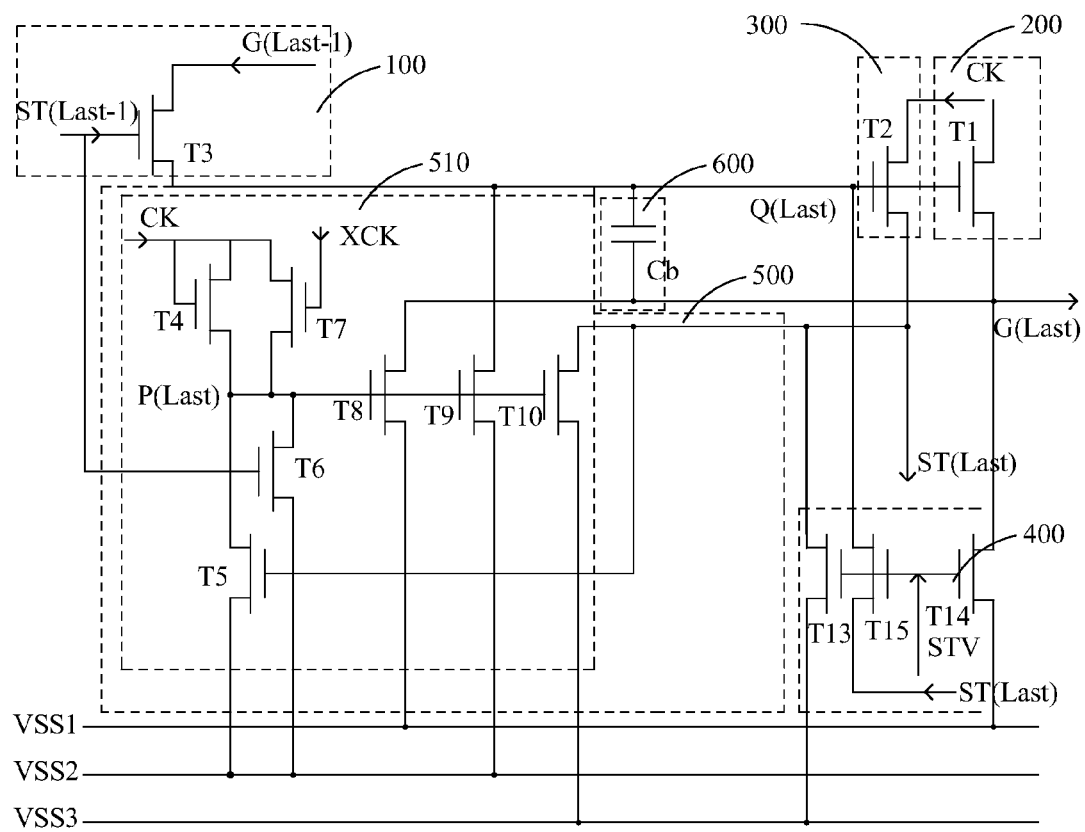
FIG. 9 is a picture showing the last stage GOA of the second embodiment of the gate driver basing on IGZO process of the present invention.

Please refer to FIG. 5 and FIG. 9 which show the second embodiment of the gate driver basing on IGZO process of the present invention. The FIG. 5 and FIG. 3 have the same components, connections, functions and operating principles, which would be omitted here. The difference between the first and second embodiment is the said pull-down part 400 further comprising the fourteenth transistor T14. The gate of the fourteenth transistor T14 electrically connects the driving signal terminal ST(N+1) of the N+1$^{th}$-stage GOA, the source of the fourteenth transistor T14 electrically connects the output terminal G(N), the drain of the fourteenth transistor T14 electrically connects the first negative supply VSS1. The fourteenth transistor T14 is used for pulling down the electrical potential of the output terminal G(N) when the gate driver is not working. Since the present invention is a GOA basing on IGZO process, its W, its parasitic capacitance, and undulating current are all small; the impact of the output terminal is also smaller than a-Si GOA. Therefore, it may design the gate driver without the fourteenth transistor T14 to save area and reduce consumption.

Besides, showed as FIG. 9, in the second embodiment, the gate of the fourteenth transistor T14 electrically connects the starting signal STV within the last-stage connection of the gate driver basing on IGZO process. The others in the second embodiment are the same as in the first embodiment, which would be omitted here.

Figure 6:
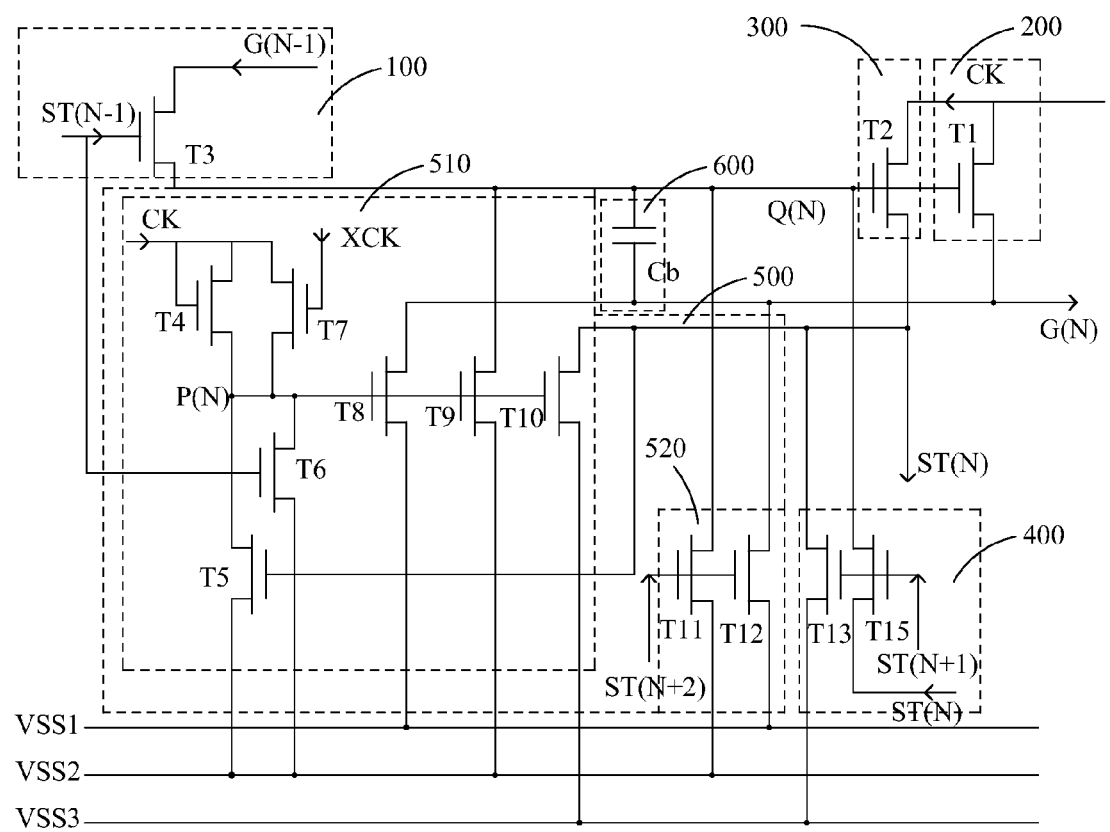
FIG. 6 is a picture showing circuits of the third embodiment of the gate driver basing on IGZO process of the present invention.
Figure 10:
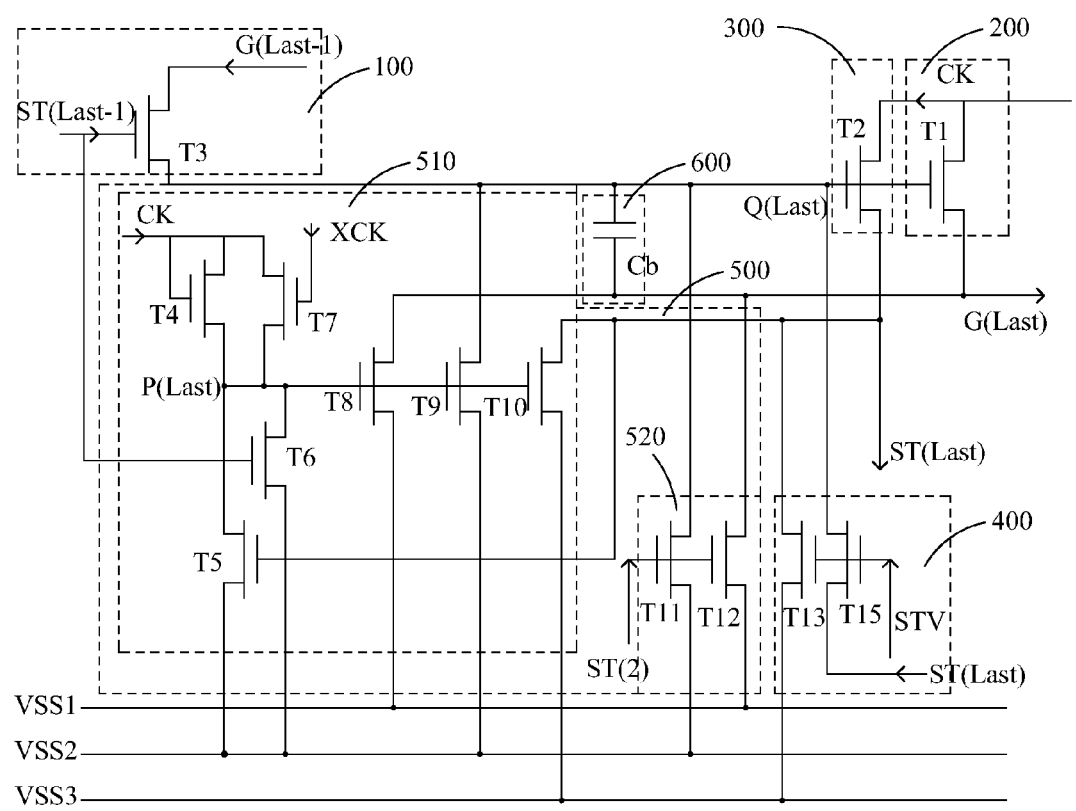
FIG. 10 is a picture showing the last stage GOA of the third embodiment of the gate driver basing on IGZO process of the present invention.

Please refer to FIG. 6 and FIG. 10 which show the third embodiment of the gate driver basing on IGZO process of the present invention. The FIG. 6 and FIG. 3 have the same components, connections, functions and operating principles, which would be omitted here. The difference between the first and third embodiment is the said pull-down part 500 further comprises a second pull-down holding circuit 520 which further comprising a eleventh transistor T11 and a twelfth transistor T12.

The gate of the eleventh transistor T11 electrically connects the driving signal terminal ST(N+2) of the N+2$^{th}$-stage GOA, the source of the eleventh transistor T11 electrically connects the first node Q(N), the drain of the eleventh transistor T11 electrically connects the second negative supply VSS2.

The gate of the twelfth transistor T12 electrically connects the driving signal terminal ST(N+2) of the N+2$^{th}$-stage GOA, the source of the twelfth transistor T12 electrically connects the output terminal G(N), the drain of the twelfth transistor T12 electrically connects the first negative supply VSS1.

The said eleventh transistor T11 is used for pulling down the electrical potential of the first node Q(N) when the gate driver is not working; and the said twelfth transistor T12 is used for pulling down the electrical potential of the output terminal G(N) when the gate driver is not working.

Since the present invention is a GOA basing on IGZO process, its W, its parasitic capacitance, and undulating current are all small; the impact of the electrical potential of the first node Q(N) and the output terminal G(N) are also smaller than a-Si GOA. Therefore, it may design the gate driver without the eleventh transistor T11 and twelfth transistor T12 to save area and reduce consumption.

Besides, showed as FIG. 10, in the third embodiment, the gate of eleventh transistor T11 and twelfth transistor T12 electrically connect the driving signal terminal ST(2) of the second-stage GOA within the last-stage connection of the gate driver basing on IGZO process.

Figure 11:
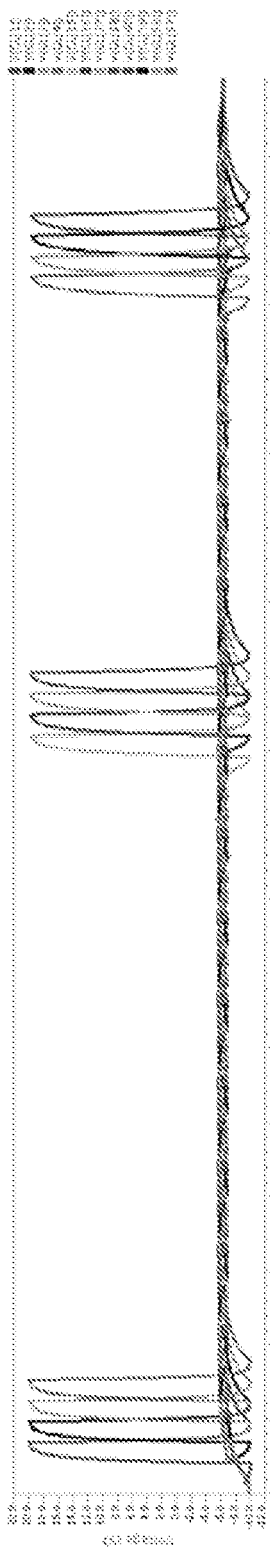
FIG. 11 is a picture of the simulation of the gate driver basing on IGZO process of the present invention.

Please refer to the FIG. 11, the simulation of the 60 stages GOA of the embodiment of the gate driver basing on IGZO process of the present invention shows well outputs.

In summary, the gate driver basing on IGZO process of the present invention using three gradually decreasing negative supplies, the first node, and the second node shall pull down the electrical potential of the driving signal to overcome the electrical leakage of the TFTs of the gate driver with IGZO process. Besides, the gate driver of the present invention using the driving signal to handle the electrical potential of the second node shall reduce the loading effect of the first node, stabilize the first node well and it is helpful for stabilizing outputting of the output terminal; the fifteenth transistor T15 of the pull-down part directly connecting the driving signal terminal shall pull down the first node faster and minimize the delay of the first node. Finally, a one-side asymmetric pull-down holding design according to the IGZO material shall save the amount of TFTs effectively, minimize the parasitic capacitances of the TFTs reasonably, and save the consumption of the gate driver effectively.

Although the description above contains much specificity, these should not be construed as limiting the scope of the embodiment but as merely providing illustrations of some of the presently preferred embodiments. Rather, the scope of the invention is to be determined only by the appended claims and their equivalents.

What is claimed is:
1. A gate driver basing on IGZO process, comprising:
  GOAs in cascade connection comprising a N$^{th}$-stage GOA, wherein the N is a positive integer, wherein the N$^{th}$-stage GOA further comprising:
  a pull-up part having a first transistor, wherein a gate of the first transistor electrically connects a first node, a source of the first transistor electrically connects a first clock signal, a drain of first transistor electrically connects an output terminal, wherein the first transistor is used for outputting signals on the output terminal according to the first clock signal;

a transfer part having a second transistor, wherein a gate of the second transistor electrically connects the first node, a source of the second transistor electrically connects the first clock signal, a drain of the second transistor electrically connects a driving signal terminal, wherein the second transistor is used for outputting the diving signal from the driving signal terminal according to the first clock signal;

a pull-up control part having a third transistor, wherein a gate of the third transistor electrically connects the driving signal terminal of a N−1$^{th}$-stage GOA, a source of the third transistor electrically connects the output terminal of the N−1$^{th}$-stage GOA, the drain of the third transistor electrically connects the first node, wherein the third transistor is used for conducting the pull-up part according to the driving signal from the driving signal terminal;

a pull-down holding part having a first pull-down holding circuit, the first pull-down holding circuit further comprising a fourth transistor, a fifth transistor, a sixth transistor, a seventh transistor, a eighth transistor, a ninth transistor, and a tenth transistor;

wherein a gate of the fourth transistor electrically connects the first clock signal, a source of the fourth transistor electrically also connects the first clock signal, a drain of fourth transistor electrically connects a second node, a gate of the fifth transistor electrically connects the driving signal terminal, a source of the fifth transistor electrically connects the second node, a drain of the fifth transistor electrically connects a second negative supply, a gate of the sixth transistor electrically connects the driving signal terminal of the N−1$^{st}$-stage GOA, a source of the sixth transistor electrically connects the second node, a drain of the sixth transistor electrically connects the second negative supply, a gate of the seventh transistor electrically connects the second clock signal, a source of the seventh transistor electrically connects the first clock signal, a drain of the seventh transistor electrically connects the second node, a gate of the eighth transistor electrically connects the second node, a source of the eighth transistor electrically connects the output terminal, a drain of the eighth transistor electrically connects a first negative supply, a gate of the ninth transistor electrically connects the second node, a source of the ninth transistor electrically connects the first node, a drain of the ninth transistor electrically connects the second negative supply, a gate of the tenth transistor electrically connects the second node, a source of the tenth transistor electrically connects the driving signal terminal, a drain of the tenth transistor electrically connects a third negative supply, wherein the fifth transistor and the sixth transistor are used for pulling down the electrical potential of the second node when the driving signal terminal is in a high electrical potential;

a pull-down part having a thirteenth transistor and a fifteenth transistor, wherein a gate of the thirteenth transistor electrically connects a driving signal terminal of the N+1$^{th}$-stage GOA, a source of the thirteenth transistor electrically connects the driving signal terminal, a drain of the thirteenth transistor electrically connects the third negative supply, a gate of the fifteenth transistor electrically connects the driving signal terminal of the N+1$^{th}$-stage GOA, a source of the fifteenth transistor electrically connects the first node, a drain of the fifteenth transistor electrically connects the driving signal terminal, wherein the thirteenth transistor is used for pulling down the electrical potential of the driving signal terminal to prevent the electrical leakages of the fifteenth transistor and the sixth transistor when the gate driver is not working, wherein the fifth transistor is used for pulling down the electrical potential of the first node rapidly when the outputting terminal finishes outputting;

a boost part having a capacitor, wherein the capacitor electrically connects the first node and the output terminal, wherein the boost part is used for pulling up the electrical potential of the first node again to make sure the outputting terminal of the pull-up part output normally; and channels of the TFT switches of the gate driver basing on the IGZO process are oxide semiconductor channels.

2. The gate driver basing on IGZO process according to claim 1, wherein the gate and source of the third transistor are both electrically connect the starting signal within the first-stage connection of the gate driver.

3. The gate driver basing on IGZO process according to claim 1, wherein the gate of the thirteenth transistor and the gate of the fifteenth transistor both electrically connect the starting signal within the last-stage connection of the gate driver.

4. The gate driver basing on IGZO process according to claim 1, wherein the pull-down holding further comprising a second pull-down holding circuit having a eleventh transistor and a twelfth transistor; wherein a gate of the eleventh transistor electrically connects a driving signal terminal of the N+2$^{th}$-stage GOA, a source of the eleventh transistor electrically connects the first node, a drain of the eleventh transistor electrically connects the second negative supply, a gate of the twelfth transistor electrically connects the driving signal terminal of the N+2$^{th}$-stage GOA, a source of the twelfth transistor electrically connects the output terminal, a drain of the twelfth transistor electrically connects the first negative supply.

5. The gate driver basing on IGZO process according to claim 4, wherein the gate of the eleventh transistor and the gate of the twelfth transistor both electrically connect the driving signal of the second-stage GOA within the last-stage connection of the gate driver.

6. The gate driver basing on IGZO process according to claim 1, wherein the pull-down part further comprises a fourteenth transistor, wherein a gate of the fourteenth transistor electrically connects the driving signal terminal of the N+1$^{th}$-stage GOA, a source of the fourteenth transistor electrically connects the output terminal, a drain of the fourteenth transistor electrically connects the first negative supply.

7. The gate driver basing on IGZO process according to claim 6, wherein the gate of the fourteenth transistor electrically connects the starting signal within the last-stage connection of the gate driver.

8. The gate driver basing on IGZO process according to claim 1, wherein the electrical potential of the first negative supply is higher than the electrical potential of the second negative supply and the electrical potential of the second negative supply is higher than the electrical potential of the third negative supply.

9. The gate driver basing on IGZO process according to claim 8, wherein the first negative supply is used for pulling down the electrical potential of the output terminal, the second negative supply is used for pulling down the electrical potential of the first node and the second node, and third negative supply is used for pulling down the electrical potential of the driving output terminal.

10. The gate driver basing on IGZO process according to claim 1, wherein the first clock signal and the second clock signal are high frequency clock signals with 180 degree phase difference from each other.

* * * * *